United States Patent
Inoue

(10) Patent No.: US 6,805,274 B2
(45) Date of Patent: Oct. 19, 2004

(54) SOLDER BALL ATTRACTING MASK AND ITS MANUFACTURING METHOD

(75) Inventor: Kazuhiko Inoue, Munakata (JP)

(73) Assignee: Kyushu Hitachi Maxell, Ltd., Fukuoka (JP)

(*) Notice: Subject to any disclaimer, the term of this patent is extended or adjusted under 35 U.S.C. 154(b) by 0 days.

(21) Appl. No.: 10/229,153

(22) Filed: Aug. 28, 2002

(65) Prior Publication Data
US 2003/0042287 A1 Mar. 6, 2003

(30) Foreign Application Priority Data
Aug. 28, 2001 (JP) ........................... 2001-258344

(51) Int. Cl.$^7$ ................. B23K 37/06; B23K 37/00; B23K 37/04
(52) U.S. Cl. ................. 228/39; 228/33; 228/41; 228/49.5; 228/245; 228/246
(58) Field of Search ................. 228/39, 33, 41, 228/49.5, 1.1, 245, 246, 180.22; 216/12; 101/127, 128.21, 128.4

(56) References Cited

U.S. PATENT DOCUMENTS

| | | | |
|---|---|---|---|
| 4,080,267 A | * | 3/1978 | Castellani et al. ............ 430/5 |
| 4,871,110 A | * | 10/1989 | Fukasawa et al. ........... 228/245 |
| 6,321,972 B1 | * | 11/2001 | May et al. ..................... 228/41 |
| 6,510,977 B1 | * | 1/2003 | Hertz .......................... 228/246 |
| 6,571,007 B1 | * | 5/2003 | Shimokawa et al. ......... 382/147 |

FOREIGN PATENT DOCUMENTS

| | | | |
|---|---|---|---|
| JP | 7-202401 A | | 8/1995 |
| JP | 08-183151 A | * | 7/1996 |
| JP | 10-034870 A | * | 2/1998 |
| JP | 10-228114 A | * | 8/1998 |
| JP | 10-323962 A | * | 12/1998 |
| JP | 2001-350269 A | * | 12/2001 |

* cited by examiner

Primary Examiner—L. Edmondson
(74) Attorney, Agent, or Firm—Birch, Stewart, Kolasch & Birch, LLP

(57) ABSTRACT

A solder ball attracting mask which is mounted on a suction apparatus for sucking a plurality of solder balls under vacuum so as to place the solder balls on electrodes of an electronic component and formed with a plurality of through-holes for attracting the solder balls thereto, with the solder ball attracting mask having a principal face engageable with the solder balls and a rear face engageable with the suction apparatus such that the through-holes extend through the solder ball attracting mask from the principal face to the rear face, the through-holes each including a funnellike attraction area for attracting the solder ball thereto, which reduces its diameter gradually from the principal face towards the rear face up to a suction port and a suction hole which has a diameter larger than that of the suction port and extends from the suction port to the rear face to define a suction space.

1 Claim, 5 Drawing Sheets

SOLDER BALL ATTRACTING MASK AND ITS MANUFACTURING METHOD

BACKGROUND OF THE INVENTION

1. Field of the Invention

The present invention generally relates to a solder ball sucking apparatus for placing, through vacuum attraction, solder balls on electrodes of electronic components such as a semiconductor chip and a circuit board and more particularly, to a solder ball attracting mask mounted on the solder ball sucking apparatus and its manufacturing method.

2. Description of the Prior Art

Conventionally, in case solder balls are placed on electrodes formed in a predetermined array on a semiconductor chip or a circuit board, a number of solder balls are sucked under vacuum at a time by a suction apparatus mounted with a solder ball attracting mask having suction holes in a predetermined pattern and then, are placed on the electrodes upon cancellation of vacuum suction after having been transferred over the electrodes as disclosed in, for example, Japanese Patent Laid-Open Publication No. 7-202401 (1995).

However, in response to higher integration of the electronic components and higher density and more complication of an array of the electrodes in recent years, an array of the solder balls is also diversified upon increase of the number of the solder balls sucked at a time by the suction apparatus, namely, the number of through-holes formed on the solder ball attracting mask and communicating with the suction apparatus also increases and an array of the through-holes becomes complicated, so that suction forces applied to the respective through-holes drop through their dispersion and thus, an error in attraction of the solder balls is likely to occur. Meanwhile, since the solder balls become so small as to have a diameter of not more than 0.5 mm, a transfer error that the solder balls are not placed on the electrodes accurately may happen due to a so-called double ball phenomenon that the solder balls are transferred in a state where a plurality of the solder balls are attracted to one through-hole.

SUMMARY OF THE INVENTION

Accordingly, an essential object of the present invention is to provide, with a view to eliminating the above mentioned drawbacks of prior art, a solder ball attracting mask mounted on a suction apparatus, in which by giving a special shape to the solder ball attracting mask, solder balls are attracted to respective through-holes securely such that an error of attraction of the solder balls and an error of transfer of the solder balls can be eliminated.

Another important object of the present invention is to provide a method of manufacturing the solder ball attracting mask efficiently by electroforming.

In order to accomplish these objects of the present invention, a solder ball attracting mask according to the present invention is mounted on a suction apparatus for sucking a plurality of solder balls under vacuum so as to place the solder balls on electrodes of an electronic component and is formed, at its predetermined positions, with a plurality of through-holes for attracting the solder balls thereto, respectively. The solder ball attracting mask has a principal face engageable with the solder balls and a rear face engageable with the suction apparatus such that the through-holes extend through the solder ball attracting mask from the principal face to the rear face. Each of the through-holes includes a funnellike attraction area for attracting the solder ball thereto, which reduces its diameter gradually from the principal face towards the rear face up to a suction port. Each of the through-holes further includes a suction hole which has a diameter larger than that of the suction port and extends from the suction port to the rear face so as to define a suction space.

BRIEF DESCRIPTION OF THE DRAWINGS

These objects and features of the present invention will become apparent from the following description taken in conjunction with the preferred embodiment thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Figure 1A:
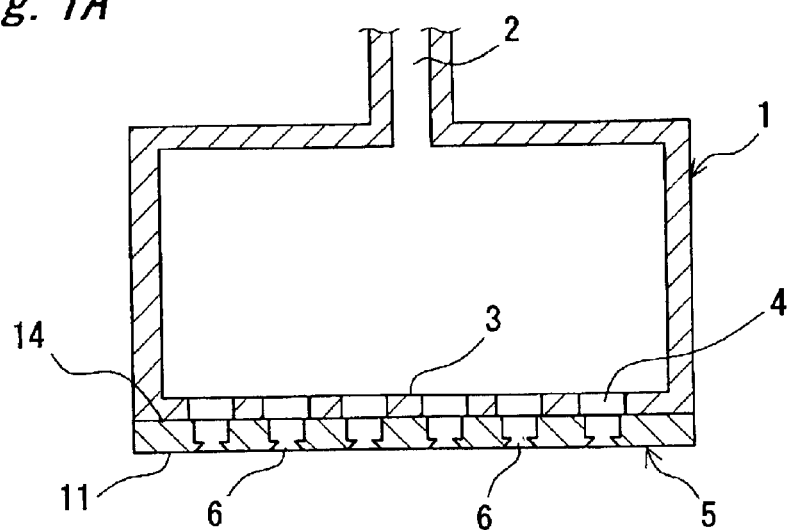
FIGS. 1A to 1C are views explanatory of operational steps of transfer of solder balls by a suction apparatus mounted with a solder ball attracting mask according to one embodiment in one aspect of the present invention.
Figure 1B:
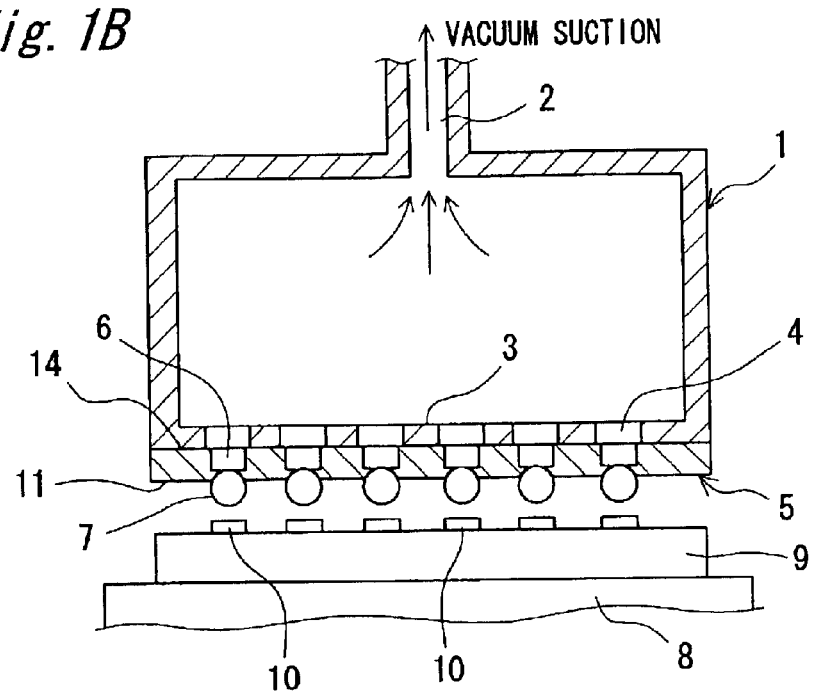
Figure 1C:
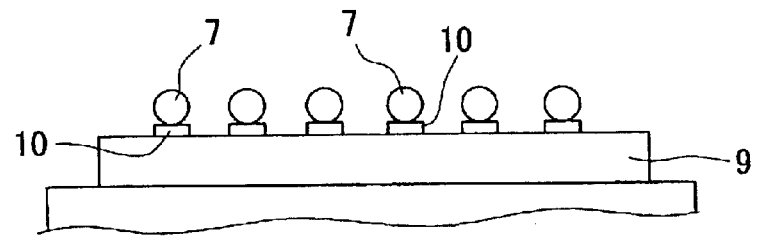
Figure 2:
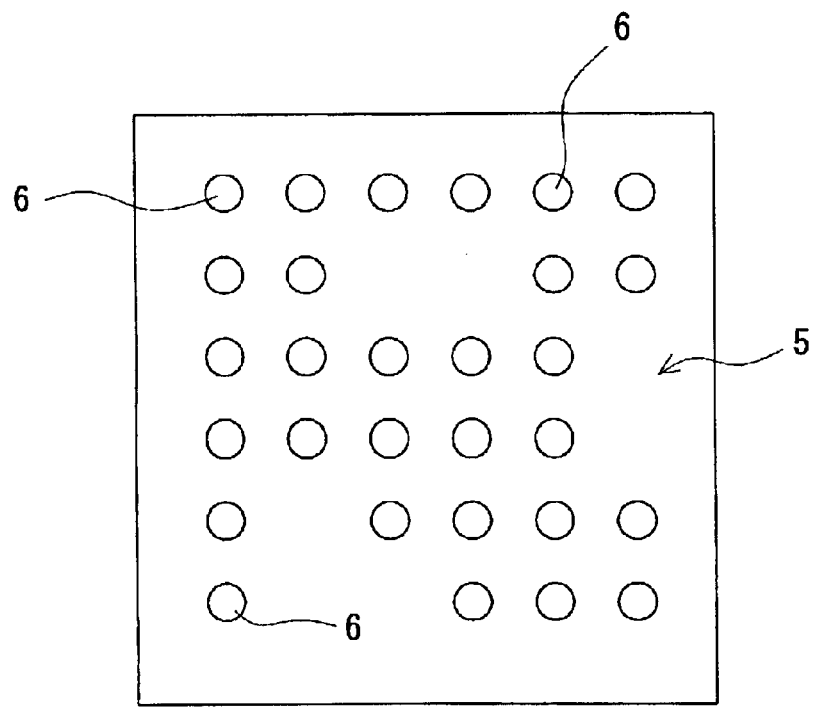
FIG. 2 is a top plan view showing one example of an array pattern of through-holes formed on the solder mask attracting mask of FIG. 1.

Hereinafter, embodiments of the present invention are described with reference to the drawings. FIGS. 1A to 1C are explanatory of operational steps of transfer of solder balls by a suction apparatus mounted with a solder ball attracting mask 5 according to one embodiment in one aspect of the present invention. The solder ball attracting mask 5 has a principal face 11 engageable with a plurality of solder balls 7 and a rear face 14 engageable with the suction apparatus. In FIG. 1A, a number of suction openings 4 are arranged, for example, in a matrix on a bottom wall 3 of a suction apparatus body 1 and the rear face 14 of the solder ball attracting mask 5 is mounted on a lower face of the bottom wall 3 of the suction apparatus body 1 so as to be brought into close contact with the lower face of the bottom wall 3 of the suction apparatus body 1. A plurality of through-holes 6 extend through the solder ball attracting mask 5 from the principal face 11 to the rear face 14 so as to be arranged in a predetermined array pattern shown in, for example, FIG. 2 and correspond to a whole or a portion of the suction openings 6 of the bottom wall 3 of the suction apparatus body 1. By performing vacuum suction via a suction pipe 2 disposed at an upper portion of the suction apparatus body 1, a plurality of the solder balls 7 are, respectively, attracted to the through-holes 6 of the solder ball attracting mask 5.

In a state where the solder balls 7 are attracted to the respective through-holes 6 of the solder ball attracting mask 5 through vacuum suction by the suction apparatus as shown in FIG. 1B, the solder balls 7 are transferred over a number of electrodes 10 of an electronic component 9 such as a semiconductor chip and a circuit board provided on a stage 8. By canceling vacuum suction in this state, the solder balls 7 are placed in a predetermined array on the electrodes 10 of the electronic component 9 at a time as shown in FIG. 1C.

Figure 3:
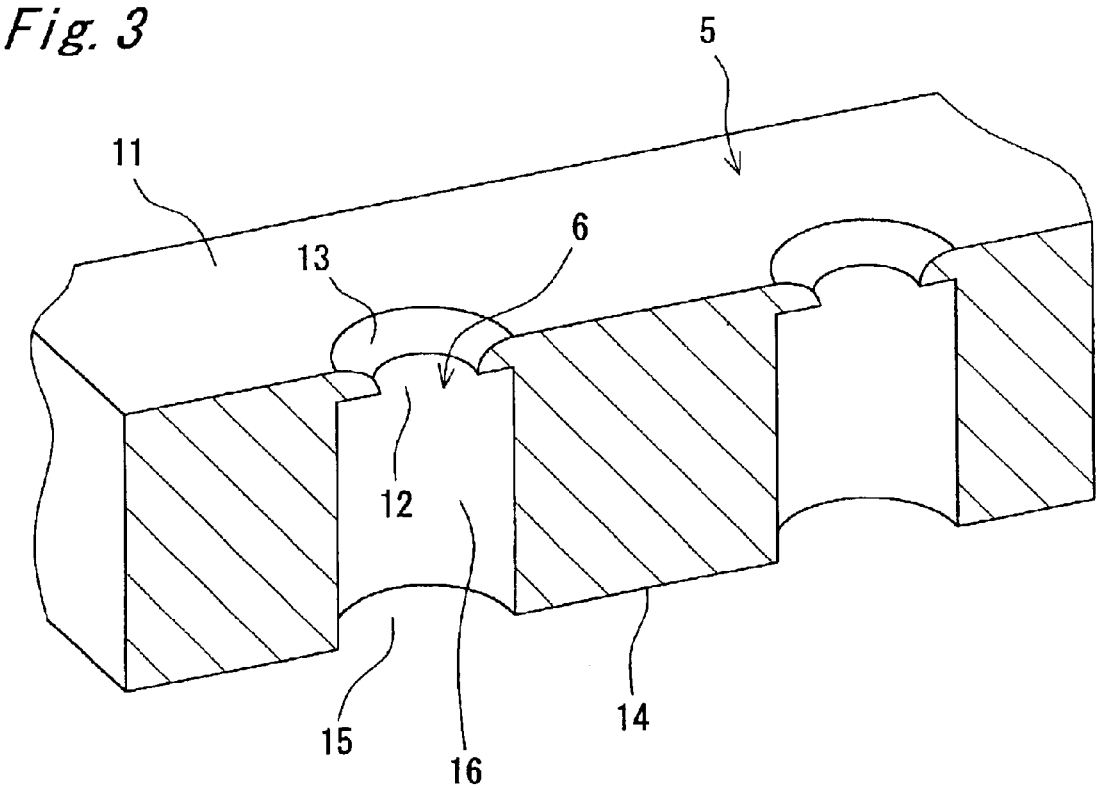
FIG. 3 is an enlarged partly sectional perspective view showing a detailed construction of the solder ball attracting mask of FIG. 1.

FIG. 3 shows a detailed construction of the through-hole 6 of the solder ball attracting mask 5. The solder ball attracting mask 5 has a thickness of, for example, about 200 to 300 µm wholly and has the principal face 11 engageable with the solder balls 9 and the rear face 14 mounted on the lower face of the bottom wall 3 of the suction apparatus body 1 as described above. The through-hole 6 extends through the solder ball attracting mask 5 from the principal face 11 to the rear face 14 and includes a funnellike attraction area 13 for attracting the solder ball 7 thereto, which reduces its diameter gradually from the principal face 11 towards the rear face 14 up to a suction port 12 having a diameter of about 80 to 100 µm and a suction hole 15 of about 150 to 200 µm in diameter, which extends from the suction port 12 to the rear face 14. The attraction area 13 has a convexly curved surface relative to an axis of the through-hole 6. The suction port 12 is disposed at a depth of about 25 to 40 µm from the principal face 11. The suction hole 15 corresponds to each of the suction openings 4 of the suction apparatus and is larger in diameter than the suction port 12 as described above. Thus, a cylindrical suction space 16 is defined from the rear face 14 up to the suction port 12 by the suction hole 15.

Figure 4:
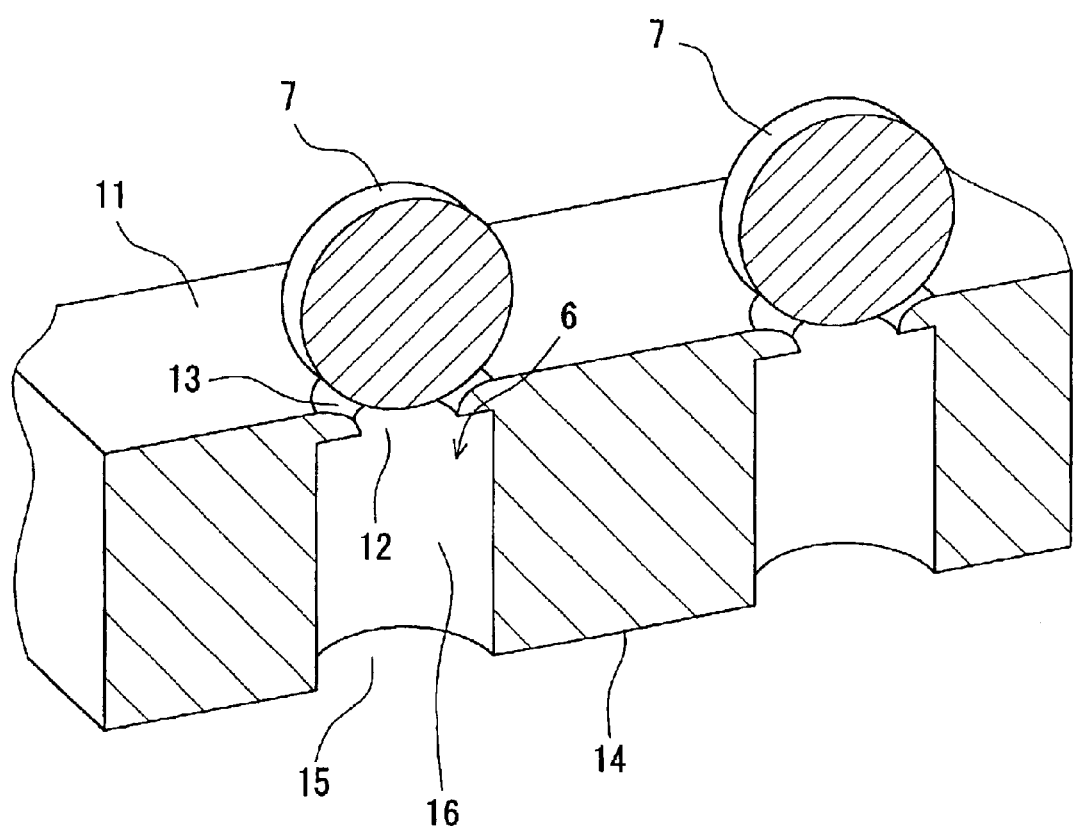
FIG. 4 is an enlarged partly sectional perspective view showing a state of attraction of the solder balls by the solder ball attracting mask of FIG. 1.

In case the solder balls 7 are attracted to the respective through-holes 6 of the solder ball attracting mask 5 of the above described arrangement through vacuum suction of the suction apparatus shown in, for example, FIG. 1A, each solder ball 7 sucked via the suction port 12 is securely guided and held by the convexly curved tapered surface of the funnellike attraction area 13 so as to be attracted thereto under vacuum as shown in FIG. 4. Furthermore, since suction pressure from the suction apparatus is initially drawn into the large-diameter suction hole 15 and then, is restricted via the suction space 16 by the small-diameter suction port 12 communicating with the suction space 16, attraction pressure at the attraction area 13 is increased at this time. As a result, each solder ball 7 can be securely attracted to and held by the attraction area 13 through the suction port 12.

In the solder ball attracting mask 5 of the present invention, since the attraction area 13 for attracting the solder ball 7 thereto in the through-hole 6 has the funnellike tapered surface which reduces its diameter from the principal face 11 towards the rear face 14 up to the suction port 12, each solder ball 7 sucked through the suction port 12 is securely guided and held by the attraction area 13 of the through-hole 6, so that occurrence of a double ball phenomenon is prevented.

Furthermore, in each of a number of the through-holes 6 arranged in a predetermined array, since the suction hole 15 having the diameter larger than that of the suction port 12 disposed at the bottom of the attraction area 13 is formed, continuously with the suction port 12, on the rear face 14 engageable with the suction apparatus so as to define the suction space 16, vacuum pressure sucked via the large-diameter suction hole 15 from the suction apparatus is restricted by the suction port 12 communicating with the suction space 16, so that attraction pressure at the attraction area 13 is increased, so that each solder ball 7 is securely attracted to the attraction area 13.

Figure 6:
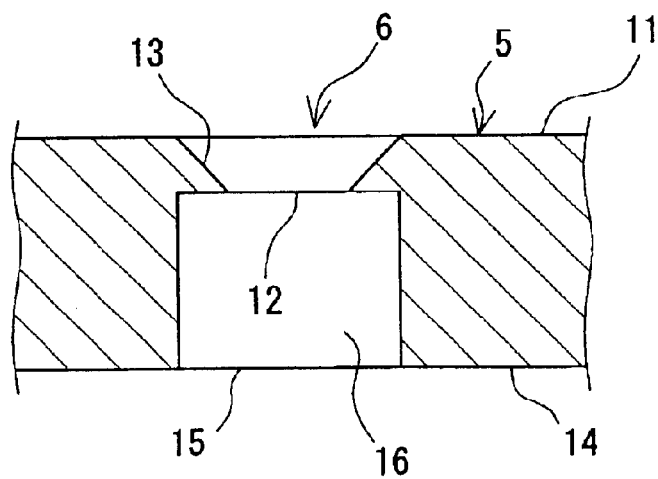
FIG. 6 is a fragmentary sectional view showing a first modification of the through-holes of the solder ball attracting mask of FIG. 1.
Figure 7:
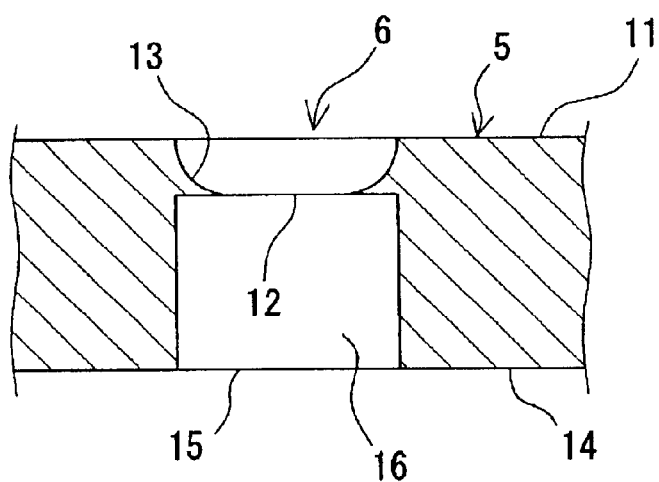
FIG. 7 is a fragmentary sectional view showing a second modification of the through-holes of the solder ball attracting mask of FIG. 1.
Figure 8:
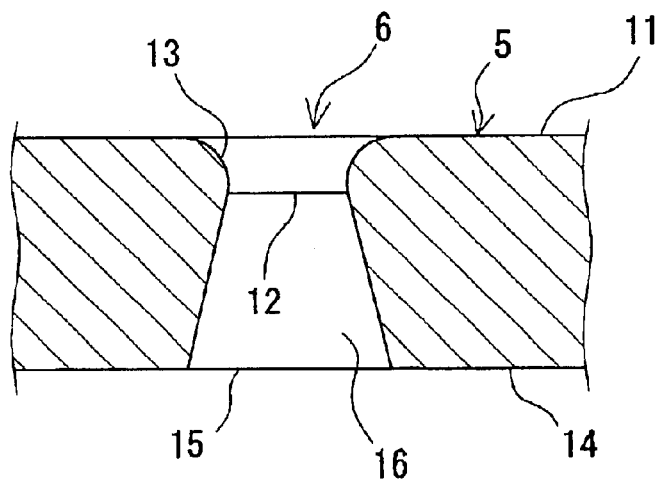
FIG. 8 is a fragmentary sectional view showing a third modification of the through-holes of the solder ball attracting mask of FIG. 1.

A construction of the through-holes 6 of the solder ball attracting mask 5 is not limited to that of the above embodiment of FIGS. 1 to 4 but can be modified variously. For example, in FIG. 6 showing a first modification of the through-holes 6 of the solder ball attracting mask 5, the convexly curved attraction area 13 of FIG. 3 is replaced by a straight tapered attraction area 13. Meanwhile, in FIG. 7 showing a second modification of the through-holes 6 of the solder ball attracting mask 5, the convexly curved attraction area 13 of FIG. 3 is replaced by a concavely curved attraction area 13. Moreover, in FIG. 8 showing a third modification of the through-holes 6 of the solder ball attracting mask 5, the cylindrical suction hole 15 of FIG. 3 is replaced by a straight tapered suction hole 15 formed continuously with the suction port 12 without any step portion therebetween and increasing its diameter towards the rear face 14.

Figure 5A:
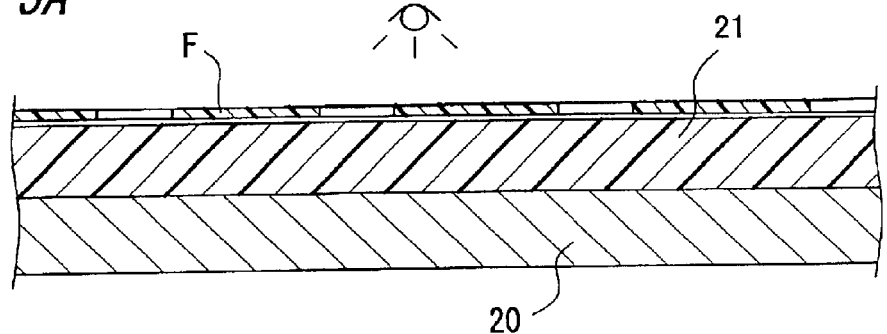
FIGS. 5A to 5E are sectional views explanatory of steps of a method of manufacturing the solder ball attracting mask of FIG. 1, according to one embodiment in another aspect of the present invention.
Figure 5B:
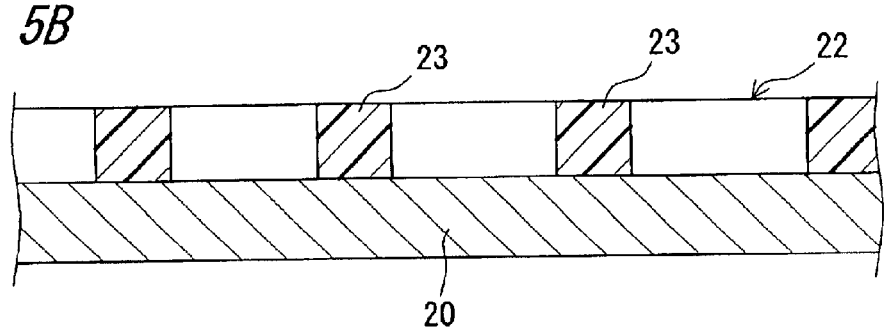

Then, a method of manufacturing the solder ball attracting mask 5, according to one embodiment in another aspect of the present invention is described with reference to FIGS. 5A to 5E. Initially, when a negative type photosensitive dry film resist is subjected to thermal contact bonding at a thickness of, for example, about 200 µm on an electrically conductive substrate 20 made of stainless steel or the like, a resist layer 21 is formed on the electrically conductive substrate 20. Then, after a pattern film F having a light transmission pattern corresponding to the through-holes 6 formed on the solder ball attracting mask 5 has been placed on the resist layer 21, ultraviolet exposure is performed as shown in FIG. 5A. Then, by performing a development step and a drying step, a resist pattern 22 having a plurality of remaining resist portions 23 corresponding to the through-holes 6, respectively at a later step is formed on the electrically conductive substrate 20 as shown in FIG. 5B.

Figure 5C:
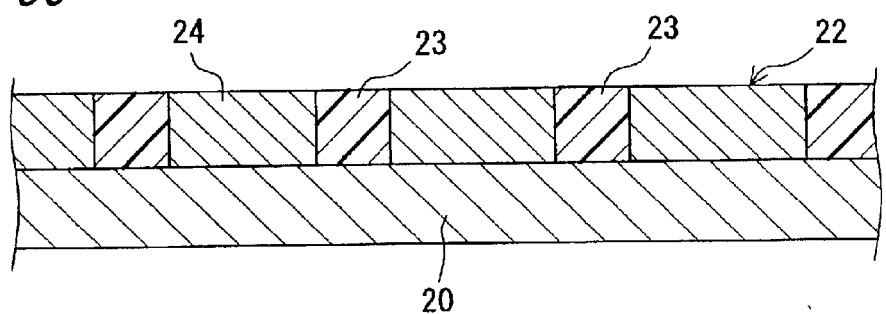

Subsequently, by carrying the electrically conductive substrate 20 into an electroforming tank in which, for example, nickel sulfamate bath is mixed at a predetermined composition, a first electroforming step of FIG. 5C is performed in which a first electroforming nickel layer 24 is formed up to a level identical with a height of the remaining resist portions 23. Meanwhile, at this time, it is desirable that the first electroforming nickel layer 24 is formed uniformly up to a height identical with that of the remaining resist portions 23. However, actually, since electroforming nickel thickness is scattered by scatter of current density and a ratio of an area of an electroformed surface to a unit area, electroforming is initially performed beyond the height of the remaining resist portions 23 and then, the electroformed surface is polished to the height of the remaining resist portions 23, thereby resulting in the state shown in FIG. 5C.

Figure 5D:
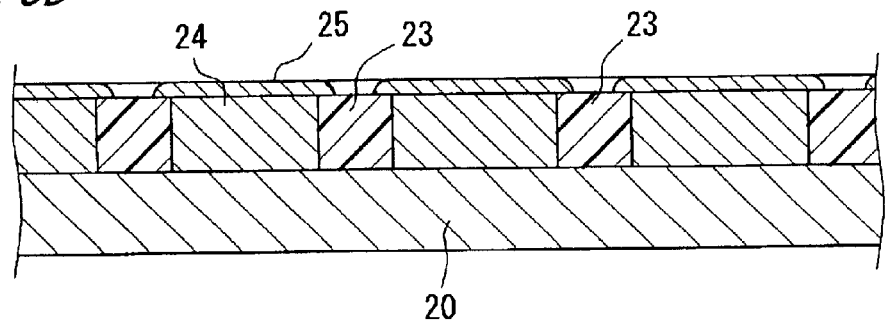

Then, by carrying the electrically conductive substrate 20 into the electroforming tank again, a second electroforming step of FIG. 5D is performed in which a second electroforming nickel layer 25 having a thickness of about 25 to 40 µm is integrally electrodeposited on a surface of the first electroforming nickel layer 24 obtained in the step of FIG. 5C such that a peripheral edge of the second electroforming nickel layer 25 overhangs the remaining resist portions 23.

Figure 5E:
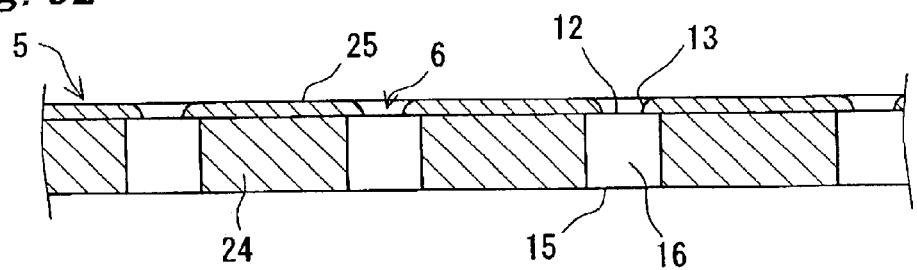

Finally, the first and second electroforming nickel layers 24 and 25 which are integrally held in close contact with each other are separated from the electrically conductive substrate 20 and the resist pattern 22 is removed from the first and second electroforming nickel layers 24 and 25 by using alkaline solvent or the like. As a result, the solder ball attracting mask 5 is obtained in which each of the through-holes 6 is constituted by the funnellike attraction area 13, the small-diameter suction port 12 and the large-diameter suction hole 15 for defining the suction space 16 as shown in FIG. 5E.

Meanwhile, in the manufacturing method of the above embodiment, nickel is employed as an electroforming metal for forming the solder ball attracting mask 5. However, the electroforming metal is not limited to nickel but it is needless to say that other electroforming metals including nickel alloys such as nickel-cobalt and nickel-phosphorus, copper and copper alloy can be used for the solder ball attracting mask 5. In addition, it goes without saying that dimensions of the solder ball attracting mask 5, for example, the thickness of the solder ball attracting mask 5 and the diameter of the through-holes 6 can be changed variously in accordance with operating conditions of the suction apparatus.

In the manufacturing method of the present invention, the solder ball attracting mask 5 of the above described arrangement can be manufactured highly accurately and efficiently by electroforming.

What is claimed is:

1. A method of manufacturing a solder ball attracting mask which is formed, at its predetermined positions, with a plurality of through-holes for attracting solder balls thereto, respectively, comprising the steps of:

forming on an electrically conductive substrate a resist pattern having a plurality of resist portions corresponding to suction holes of the through-holes, respectively;

electroforming on the electrically conductive substrate a first metal layer to a height identical with that of the resist portions;

electroforming on the first metal layer a second metal layer overhanging the resist portions such that the second metal layer forms a funnel-shaped attraction area of each of the through-holes, wherein the funnel-shaped attraction area has a convexly curved tapered surface; and separating from the electrically conductive substrate the first and second metal layers held in close contact with each other integrally and removing the resist pattern from the first and second metal layers.

* * * * *